(12) United States Patent
Tsai et al.

(10) Patent No.: US 11,234,513 B2
(45) Date of Patent: Feb. 1, 2022

(54) FIXING DEVICE IN CABINET AND CABINET USING SAME

(71) Applicant: HONGFUJIN PRECISION ELECTRONICS (TIANJIN) CO., LTD., Tianjin (CN)

(72) Inventors: Ti-An Tsai, New Taipei (TW); Hung-Liang Chung, New Taipei (TW); Hsueh-Chin Lu, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 369 days.

(21) Appl. No.: 16/394,391

(22) Filed: Apr. 25, 2019

(65) Prior Publication Data

US 2020/0315344 A1    Oct. 8, 2020

(30) Foreign Application Priority Data

Apr. 4, 2019    (CN) .......................... 201910273119.9

(51) Int. Cl.
| | |
|---|---|
| *A47B 81/00* | (2006.01) |
| *A47B 88/944* | (2017.01) |
| *D04B 1/22* | (2006.01) |
| *G02B 6/44* | (2006.01) |
| *H05K 7/14* | (2006.01) |
| *H05K 5/02* | (2006.01) |

(52) U.S. Cl.
CPC ............ *A47B 81/00* (2013.01); *A47B 88/944* (2017.01); *D04B 1/22* (2013.01); *G02B 6/444* (2013.01); *H05K 5/0221* (2013.01); *H05K 7/1492* (2013.01)

(58) Field of Classification Search
CPC .... A47B 81/00; A47B 88/944; H05K 5/0221; H05K 7/1492; G02B 6/444; D04B 1/22; E05C 1/002; E05C 1/06; E05C 1/14; E05C 17/30
USPC ................................ 70/78; 312/405.1, 321.5
See application file for complete search history.

(56) References Cited

U.S. PATENT DOCUMENTS

| | | | | |
|---|---|---|---|---|
| 2,909,212 | A * | 10/1959 | Scherer ..................... | A47C 3/26 248/408 |
| 3,770,236 | A * | 11/1973 | Marsh ....................... | A47C 3/34 248/408 |
| 4,867,406 | A * | 9/1989 | Lengacher ................ | A47C 3/26 248/409 |
| 7,309,116 | B2 * | 12/2007 | Garrett ..................... | F25D 23/04 312/405.1 |
| 2008/0238270 | A1 * | 10/2008 | Wayman ................ | H05K 7/186 312/199 |

(Continued)

*Primary Examiner* — James O Hansen
(74) *Attorney, Agent, or Firm* — ScienBiziP, P.C.

(57) ABSTRACT

A fixing device for a cabinet, and the cabinet with such fixing device, hold vulnerable components steadily in place at all times. The cabinet includes a door panel, internal components, and at least one fixing device. The door panel defines at least one locking hole and supports at least one component. Each fixing device includes a telescopic portion and an operation portion and each telescopic portion is aligned with one locking hole. The operation portion is rotatable one way to extend the telescopic portion to abut and hold the component in place, and rotatable in the reverse direction to unlock and release the component.

14 Claims, 8 Drawing Sheets

(56) References Cited

U.S. PATENT DOCUMENTS

| | | | | |
|---|---|---|---|---|
| 2009/0154159 A1* | 6/2009 | Graybill | ............... | F21K 9/00 |
| | | | | 362/249.02 |
| 2010/0290604 A1* | 11/2010 | Wright | ............... | H05K 13/00 |
| | | | | 379/102.04 |
| 2015/0098168 A1* | 4/2015 | Liang | ............... | H05K 7/1491 |
| | | | | 361/622 |
| 2015/0277517 A1* | 10/2015 | Zhang | ............... | G06F 1/188 |
| | | | | 361/622 |
| 2019/0198834 A1* | 6/2019 | Maloney | ............... | H04B 1/036 |

* cited by examiner

FIXING DEVICE IN CABINET AND CABINET USING SAME

FIELD

The subject matter herein generally relates to server cabinets.

BACKGROUND

Cabinets are configured to received servers which can be long and wide. Thus, there is small space available for placing other components inside the cabinet and some components, for example, power distributors, may be fixed to a door panel of the cabinet to save space. During transport of the cabinet, such components are vulnerable to damage.

Therefore, there is room for improvement within the art.

BRIEF DESCRIPTION OF THE DRAWINGS

Implementations of the present technology will now be described, by way of embodiments with reference to the attached figures.

DETAILED DESCRIPTION

Figure 1:
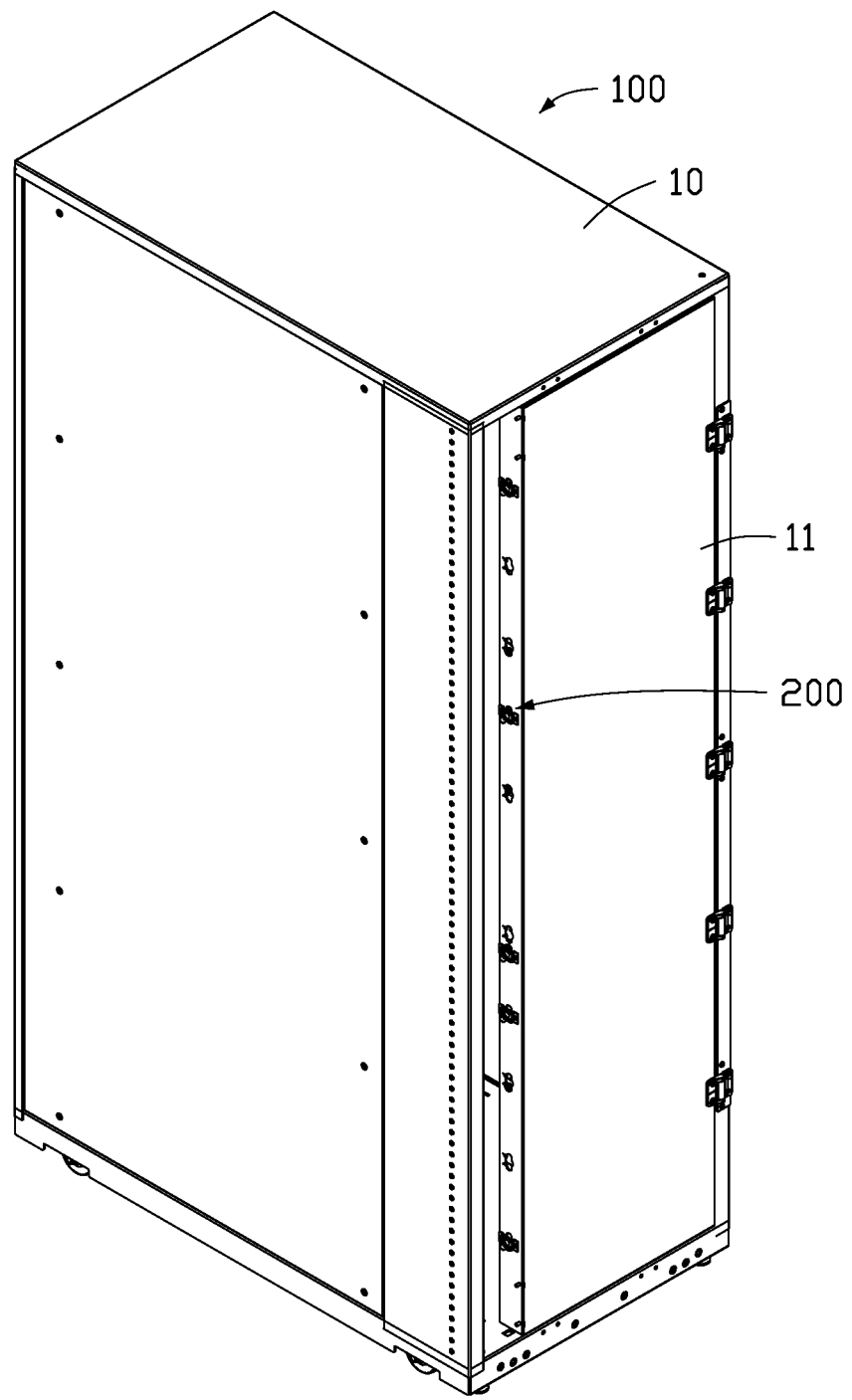
FIG. 1 is an isometric view of a cabinet according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to show details and features of the present disclosure better. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
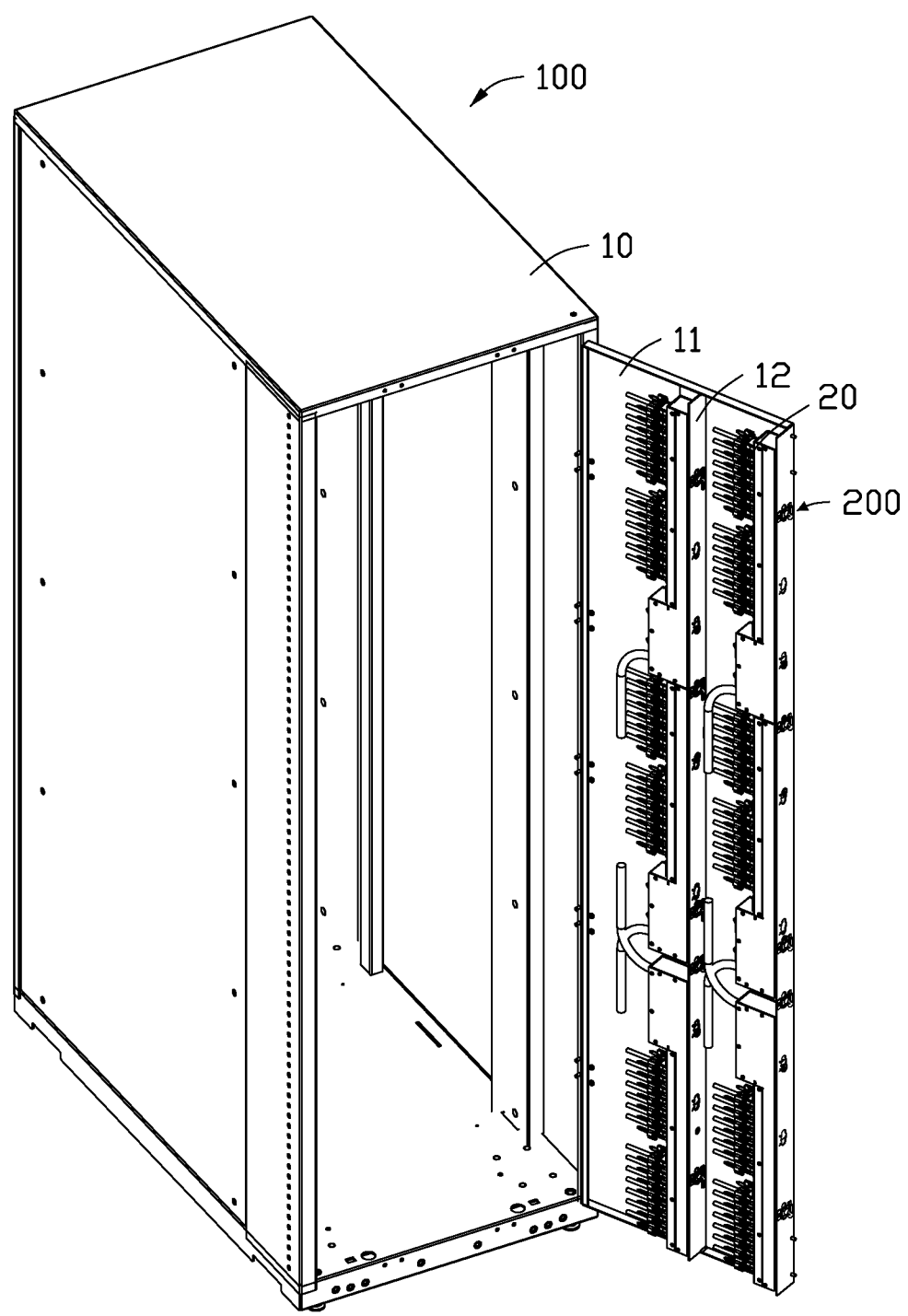
FIG. 2 is an isometric view of the cabinet of FIG. 1 with the door panel opened.
Figure 3:
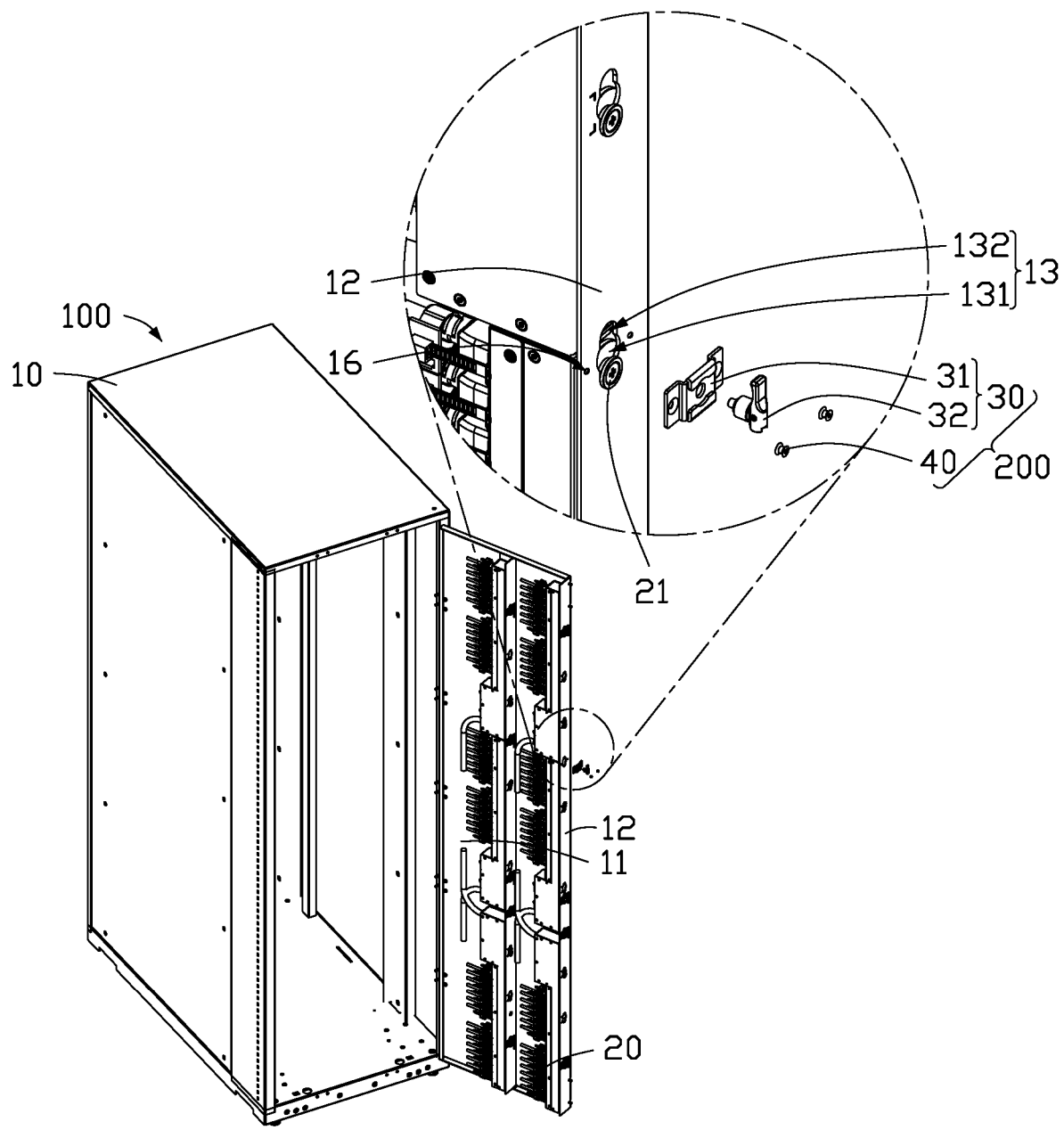
FIG. 3 is an exploded view of the cabinet of FIG. 2.

FIGS. 1 to 3 illustrate a cabinet 100 according to an embodiment of the disclosure. The cabinet 100 is configured to receive servers and other components. The cabinet 100 includes a main body 10 and a door panel 11 connected to the main body 10. The door panel 11 is rotatably coupled to the main body 10. In order to save the space inside the cabinet 100, the components can be disposed on the door panel 11. The components can include a power distributor 20. The cabinet 100 further includes a fixing device 200 connected to the door panel 11. The fixing device 200 is configured to hold the power distributor 20 steady against shaking and other forces.

The door panel 11 defines a locking hole 13. The fixing device 200 includes a latching member 30. The latching member 30 is mounted on the door panel 11 and disposed at the locking hole 13. The latching member 30 includes an telescopic portion 322 and an operation portion 321 connected to the telescopic portion 322. The operation portion 321 can expand and contract the telescopic portion 322 to fix a component in place and unlock the component.

The telescopic portion 322 is movable between a first position (not shown) and a second position (not shown). When the power distributor 20 is fixed on the door panel 11 and the operation portion 321 is rotated, the operation portion 321 drives the telescopic portion 322 from the first position out of the locking hole 13 into the second position. The latching member 30 thus holds the power distributor 20. When operation portion 321 is rotated back, the operation portion 321 brings the telescopic portion 322 from the second position back to the first position, the power distributor 20 is thereby unlocked from the door panel 11.

Referring to FIGS. 2 and 3, the door panel 11 is rotatably disposed on a sidewall of the main body 10. A fixing plate 12 is perpendicularly fixed to an end of the door panel 11 away from the sidewall. In the embodiment, the fixing plate 12 is integrally formed with the door panel 11. It can be understood that, in another embodiment, the fixing plate 12 is detachably disposed on the door panel 11.

Referring to FIG. 3, the locking hole 13 is defined on the fixing plate 12, and the latching member 30 is disposed on the fixing plate 12 in the locking hole 13. In the embodiment, the locking hole 13 includes a first locking hole 131 and two second locking holes 132. The first locking hole 131 communicates with the two second locking holes 132. A diameter of the first locking hole 131 is larger than the diameter of a second locking hole 132. The two second locking holes 132 are symmetrically disposed around the central first locking hole 131. The first locking hole 131 and the two second locking holes 132 are vertically disposed. The two second locking holes 132 are disposed on the upper and lower sides of the first locking hole 131. An end of a donut 21 passes though the first locking hole 131 and moves downward to lock in one of the second locking holes 132. When the door panel 11 is rotated 180 degrees away from the main body 10, the power distributor 20 also can be disposed in the other second locking hole 132. The fixing plate 12 further defines two fixing holes 16 disposed at sides of the locking hole 13. The two fixing holes 16 are configured to mount the catching member 30.

If the door panel 11 does not need to be rotated through 180 degrees, the locking hole 13 may include the first locking hole 131 and one of the second locking holes 132. In another embodiment, the locking hole 13 is defined on the door panel 11 to fix the power distributor 20 on the door panel 11.

Figure 4:
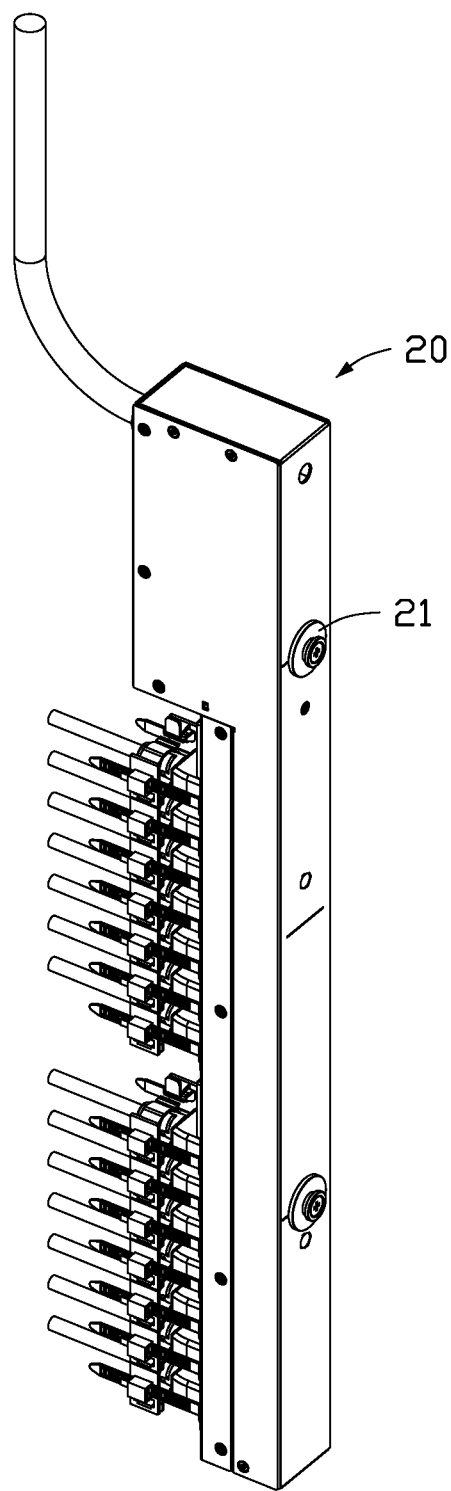
FIG. 4 is an isometric view of a component disposed on the door panel of FIG. 2.

Referring to FIG. 4, the power distributor 20 includes the donut 21. The power distributor 20 is fixed in the locking hole 13 by the donut 21. The power distributor 20 passes through the first locking hole 131 and moves downward by its own weight to the second locking hole 132, to be locked at the second locking hole 132. The power distributor 20 and the latching member 30 are disposed on opposite sides of the fixing plate 12. When the power distributor 20 is fastened to the locking hole 13, the latching member 30 presses on the donut 21 to stabilize the power distributor 20 in its location. In the embodiment, the donut 21 is disposed on an end surface of the power distributor 20 in contact with the fixing plate 12. It can be understood that, when the power distributor 20 is disposed on the door panel 11, the donut 21 is disposed on the end surface of the power distributor 20 in contact with the door panel 11.

Figure 5:
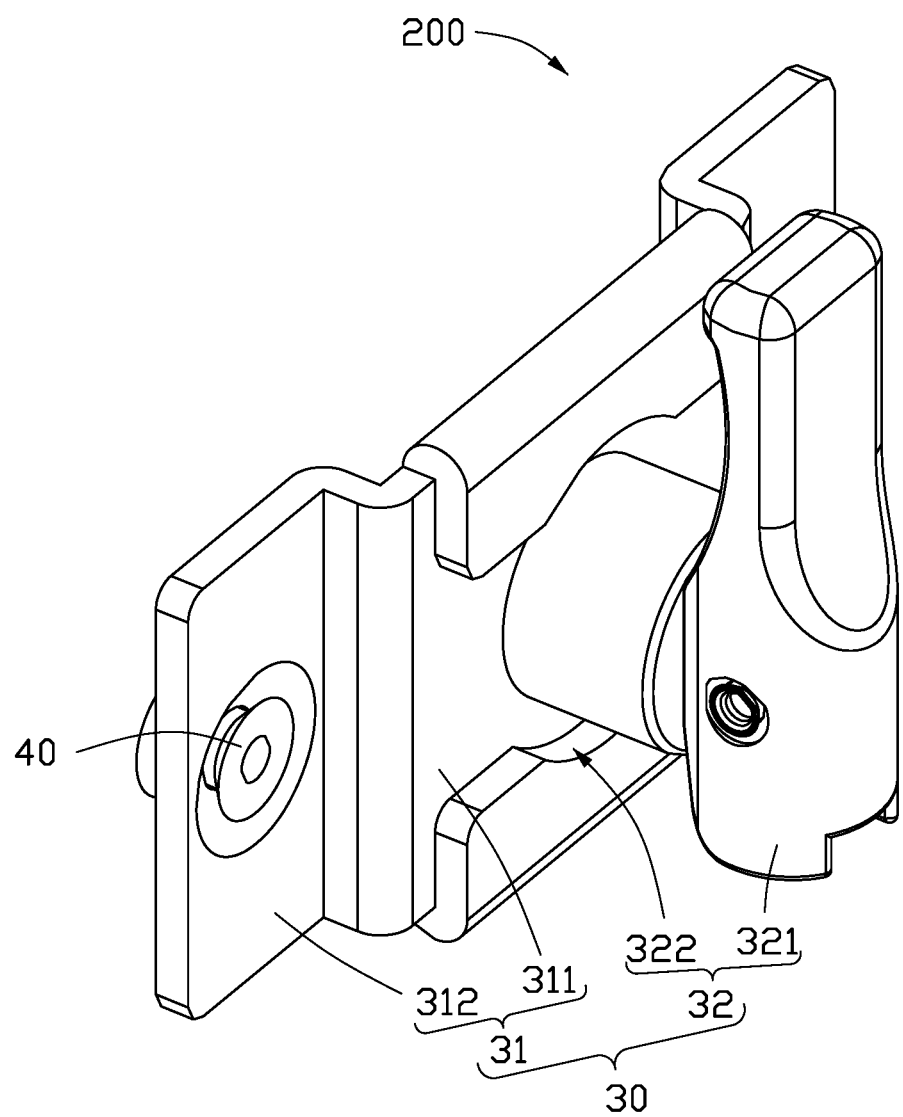
FIG. 5 is an isometric view of a fixing device in the cabinet of FIG. 3.
Figure 6:
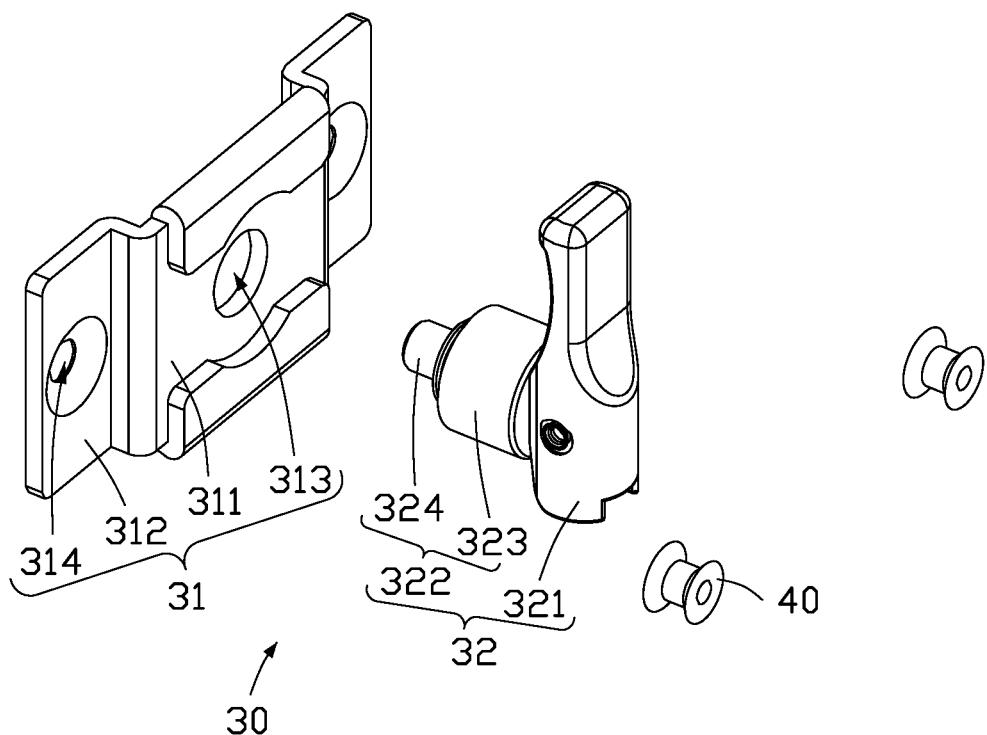
FIG. 6 is an exploded view of the fixing device of FIG. 5.

Referring to FIGS. 5 and 6, the latching member 30 includes a fixing bracket 31 and a stop pin 32 mounted on the fixing bracket 31. The fixing bracket 31 is mounted at the locking hole 13. The stop pin 32 abuts the power distributor 20. The fixing device 200 further includes two fasteners 40. The latching member 30 is fixed to the fixing plate 12 through fasteners 40.

Referring to FIG. 3, FIG. 5 and FIG. 6 , the fixing bracket 31 is substantially U-shaped. The fixing bracket 31 includes a first fixing portion 311 and a second fixing portion 312 extending from each side of the first fixing portion 311. The first fixing portion 311 and the second fixing portion 312 are not in the same plane. The first fixing portion 311 defines a first through hole 313, and each second fixing portion 312 defines a second through hole 314. The stop pin 32 is disposed at the first through hole 313 to abut the power distributor 20. The second through hole 314 is aligned with the fixing hole 16. The fastener 40 extends through the second through hole 314 and the fixing hole 14 to fix the fixing bracket 31 on the fixing plate 12. The fixing bracket 31 is substantially perpendicular to the locking hole 13 and the first fixing portion 311 is substantially disposed at the first locking hole 131.

Referring to FIG. 6, the operation portion 321 and the telescopic portion 322 are disposed on the stop pin 32. The operation portion 321 is rotatable to drive the telescopic portion 322 to expand and contract. The telescopic portion 322 can abut the power distributor 20. The stop pin 32 includes a third fixing portion 323. The telescopic portion 322 is a telescoping rod. The third fixing portion 323 is locked in the first through hole 313. The telescopic portion 322 is connected to the third fixing portion 323. An end of the telescopic portion 322 away from the fixing bracket 31 is rotatably connected to the operation portion 321.

Figure 7:
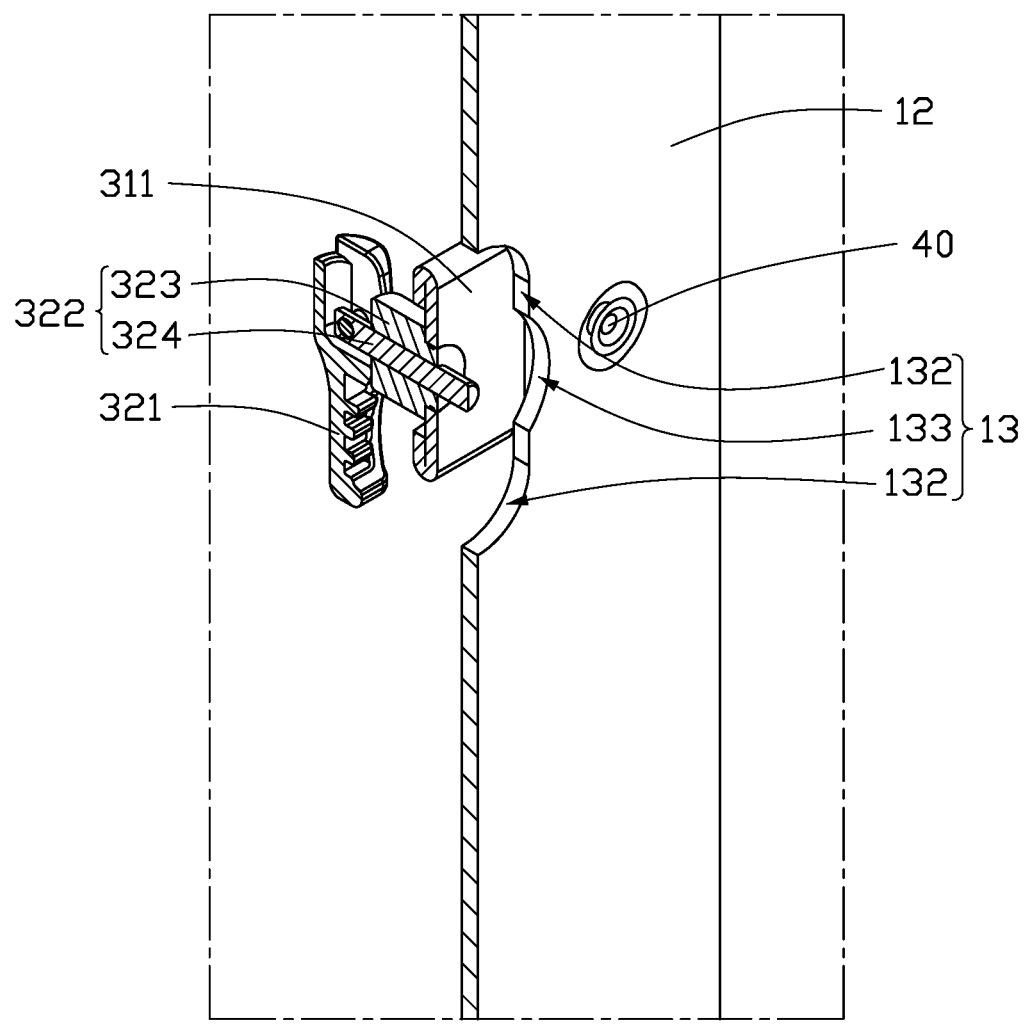
FIG. 7 is a cross-sectional view showing the fixing device of FIG. 2 extended.
Figure 8:
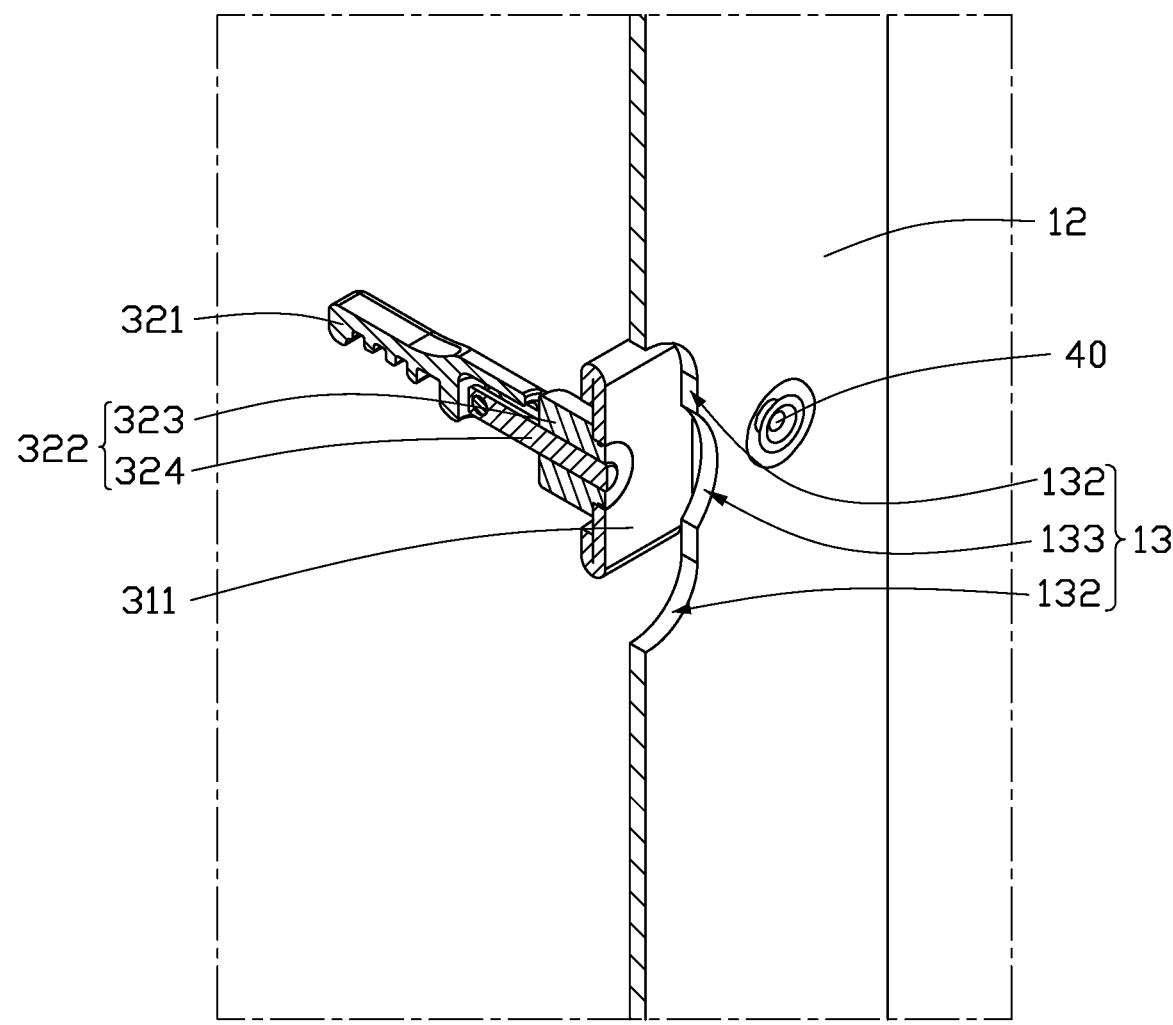
FIG. 8 is a cross-sectional view showing the fixing device of FIG. 2 retracted.

Referring to FIG. 8, when the operation portion 321 is rotated to align with the telescopic portion 322, the telescopic portion 322 is located at the first position, where the telescopic portion 322 does not abut the power distributor 20. Referring to FIG. 7, when the operating portion 321 is rotated to move the telescopic portion 322 from the first position to the second position, the telescopic portion 322 extends out of the first through hole 313 and resists against the power distributor 20.

In the embodiment, a number of the power distributors 20 are disposed on the cabinet 100, and at least that number of fixing devices 200 can be employed in the cabinet 100.

The fixing device 200 and the cabinet 100 provided a better use of the space of the cabinet 100.

The power distributors 20 are positioned on the door panel 11 to save space in the cabinet 100. The power distributors 20 are held firmly and stably on the door panel 11 through the fixing device 200 to prevent damage to the power distributors 20 during transportation.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A cabinet comprising:
    a door panel defines at least one locking hole;
    at least one component connected to the door panel;
    at least one fixing device, each fixing device comprising:
        a telescopic portion aligned with one of the locking holes; and
        an operation portion connected to the telescopic portion;
    wherein the operation portion is rotatable in a first direction to drive the telescopic portion to extend out of one of the locking holes to position inside of the door panel and abut the component, and the operation portion is rotatable in a second direction to reset to outside of the door panel to unlock the component, the fixing device comprises a fixing bracket and a stop pin fixed to the fixing bracket, the fixing bracket is mounted at the locking hole, the stop pin comprises the telescopic portion and the operation portion, the fixing bracket comprises a first fixing portion and two second fixing portions extending from opposite sides of the first fixing portion, the stop pin is connected to the first fixing portion, and the two second fixing portions are fixed to the door panel.

2. The cabinet of claim 1, wherein the first fixing portion defines a first through hole, the stop pin passes through the first through hole and the locking hole to abut the component.

3. The cabinet of claim 1, wherein each second fixing portion defines a second through hole, the second through holes are aligned with two fixing holes defines on the door panel, two fasteners pass through the second through holes and the fixing holes to fix the fixing bracket to the door panel.

4. The cabinet of claim 1, wherein the component comprises a donut, the donut is locked in the locking hole, when the fixing device abuts the component, the fixing device presses on the donut.

5. The cabinet of claim 4, wherein the locking hole comprises a first locking hole and at least one second locking hole, the first locking hole communicates with the second locking hole, a diameter of the first locking hole is larger than the diameter of the second locking hole, an end of the donut passes through the first locking hole and moves toward the second locking hole to lock in the second locking hole.

6. The cabinet of claim 5, wherein the locking hole comprises two second locking holes, the two second locking holes are symmetrically disposed with the first locking hole as a center.

7. The cabinet of claim 1, wherein the cabinet comprises a main body, the door panel is rotatably disposed on a lateral sidewall of the main body, a fixing plate is perpendicularly fixed to an end of the door panel away from the lateral sidewall.

8. The cabinet of claim 7, wherein the at least one locking hole is defined on the fixing plate.

9. The cabinet of claim 1, wherein the component is power distributor.

10. A cabinet comprising:
a door panel defines at least one locking hole;
at least one component, each component comprising a donut locked in one of the locking hole; and
at least one fixing device, each fixing device comprising:
a telescopic portion aligned with one of the locking holes; and
an operation portion connected to the telescopic portion;
wherein the operation portion is rotatable in a first direction to drive the telescopic portion to extend out of one of the locking holes to position inside of the door panel to abut the component and press on the donut, and the operation portion is rotatable in a second direction to reset to outside of the door panel to unlock the component, the fixing device comprises a fixing bracket and a stop pin fixed to the fixing bracket, the fixing bracket is mounted at the locking hole, the stop pin comprises the telescopic portion and the operation portion, the fixing bracket comprises a first fixing portion and two second fixing portions extending from opposite sides of the first fixing portion, the stop pin is connected to the first fixing portion, and the two second fixing portions are fixed to the door panel.

11. The cabinet of claim 10, wherein the first fixing portion defines a first through hole, the stop pin passes through the first through hole and the locking hole to abut the component.

12. A fixing device configured to abut a component connected to a door panel of a cabinet, the fixing device comprising:
a telescopic portion configured to be aligned with the locking hole; and
an operation portion connected to the telescopic portion;
wherein the operation portion is rotatable in a first direction to drive the telescopic portion to extend out of locking hole to position inside of the door panel and abut the component, and the operation portion is rotatable in a second direction to reset to outside of the door panel to unlock the component, the fixing device comprises a fixing bracket and a stop pin fixed to the fixing bracket, the fixing bracket is mounted at the locking hole, the stop pin comprises the telescopic portion and the operation portion, the fixing bracket comprises a first fixing portion and two second fixing portions extending from opposite sides of the first fixing portion, the stop pin is connected to the first fixing portion, and the fixing bracket is fixed to the door panel through the two second fixing portions.

13. The fixing device of claim 12, wherein the first fixing portion defines a first through hole, the stop pin passes through the first through hole and the locking hole to abut the component.

14. The fixing device of claim 12, wherein each second fixing portion defines a second through hole, the second through holes are aligned with two fixing holes defines on the door panel, two fasteners pass through the second through holes and the fixing holes to fix the fixing bracket to the door panel.

* * * * *